United States Patent

Ose et al.

[11] Patent Number: 6,043,491
[45] Date of Patent: Mar. 28, 2000

[54] SCANNING ELECTRON MICROSCOPE

[75] Inventors: Yoichi Ose, Mito; Kiyomi Yoshinari, Hitachi; Hideo Todokoro, Nishitama-gun; Mitsugu Sato, Hitachinaka, all of Japan

[73] Assignee: Hitachi, Ltd., Tokyo, Japan

[21] Appl. No.: 09/133,667

[22] Filed: Aug. 12, 1998

[30] Foreign Application Priority Data

Aug. 25, 1997 [JP] Japan ................................. 9-227792

[51] Int. Cl.[7] .................................................. H01J 37/244
[52] U.S. Cl. ............................................................ 250/310
[58] Field of Search ..................................... 250/310, 397

[56] References Cited

U.S. PATENT DOCUMENTS

| | | | |
|---|---|---|---|
| 4,442,355 | 4/1984 | Tamura et al. | 250/310 |
| 5,182,454 | 1/1993 | Matsuda et al. | 250/310 |
| 5,412,210 | 5/1995 | Todokoro et al. | 250/310 |
| 5,424,541 | 6/1995 | Todokoro et al. | 250/310 |
| 5,608,218 | 3/1997 | Sato et al. | 250/310 |
| 5,894,124 | 4/1999 | Iwabuchi et al. | 250/310 |

FOREIGN PATENT DOCUMENTS

| | | |
|---|---|---|
| 0 769 799 | 4/1997 | European Pat. Off. |
| 60-100349 | 6/1985 | Japan |
| 4-067550 | 3/1992 | Japan |
| 4-149944 | 5/1992 | Japan |
| 4-190549 | 7/1992 | Japan |
| 4-276509 | 10/1992 | Japan |
| 5-266855 | 10/1993 | Japan |
| 7-192679 | 7/1995 | Japan |
| 9-171791 | 6/1997 | Japan |
| 9-507331 | 7/1997 | Japan |
| WO95/12210 | 5/1995 | U.S. |

*Primary Examiner*—Kiet T. Nguyen
*Attorney, Agent, or Firm*—Kenyon & Kenyon

[57] ABSTRACT

A scanning electron microscope in the present invention, by employing a retarding method and suppressing interferences between an electron beam and secondary electrons or back scattered electrons, makes it possible to obtain a clearer SEM image with a higher resolution. In the scanning electron microscope in the present invention, a shield electrode 117 is provided for shielding the electron beam 104 from electric fields of an energy analyzer 118 and a detector 121, and the energy analyzer 118 and the detector 121 are located in contact with an electron beam aperture 115 and the shield electrode 117.

6 Claims, 9 Drawing Sheets

SCANNING ELECTRON MICROSCOPE

BACKGROUND OF THE INVENTION

In a scanning electron microscope (SEM), a specimen is irradiated with an electron beam while scanning the electron beam. Then, a signal by means of electrons emitted from the specimen is converted into an intensity modulation input into a CRT, thus obtaining a scanned image (SEM image) of the specimen.

Japanese Patent Laid-open No. 7-192679 discloses that electrons emitted from a specimen are separated into secondary electrons and back scattered electrons so as to obtain the SEM image, thereby observing geometric and material information of the specimen with a higher resolution. Moreover, the Japanese Patent Laid-open No. 7-192679 discloses that, by using Wien filter type electromagnetic field which deflects the secondary electrons and the back scattered electrons from an optical axis of the electron beam, a detector is brought away from the optical axis, and thus the secondary electrons and the back scattered electrons are separated and detected effectively without exerting a bad influence on the electron beam.

The SEM is applied for an observation or a length measurement of a submicron order of contact hole or line pattern formed in a wafer specimen for a semiconductor device. In such an applied field, it is required that the SEM allow the observation to be made with a 10 nm or less of high resolution without charging a non-conductive material.

Generally speaking, a specimen for a semiconductor device is constructed by accumulating a non-electric conductive material such as $SiO_2$ or $SiN$ on a conductor part such as AL or Si. When such a specimen for a semiconductor device is irradiated with an electron beam, a surface of the non-electric conductive material becomes negatively charged (hereinafter, in some cases, this phenomenon is simply referred to as "charge up"), secondary electrons are produced from a bottom part of a contact hole. However, the secondary electrons produced from the bottom part of the contact hole are prevented from moving upwards by negative charges on the surface of the non-electric conductive material, and thus are not detected by a secondary electron detector. As a result, in some cases, there occurs an abnormal contrast or a tremendous distortion in the SEM image.

Such image troubles, which are attributed to the charge up on the surface of the specimen, result in an extreme difficulty in an observation of the contact hole or a length measurement of a line and space. This makes it difficult to estimate a semiconductor fabricating process, and in addition becomes a serious obstruction to ensuring quality of the semiconductor device itself.

A literature, "Material for 117th Study Session held by Japan Society for the Promotion of Science 132nd committee, Electron and Ion Beam Science and Technology", discloses that an employment of a low voltage SEM prevents the charge up on the surface of the specimen. If, however, an accelerating voltage for irradiating the specimen becomes low, energy of the electron beam is varied. This extremely decreases the resolution through chromatic aberration, thus making it difficult to embody a 10 nm or less of high resolution. Also, the accelerating voltage becomes low, less electron current flows. This extremely decreases a ratio between a secondary signal and a noise (S/N), brings about a worse contrast as the SEM image, thus making it difficult to make the observation with a high magnification and a high resolution. In particular, in a semiconductor device such as a one fabricated by an ultra micro fabrication technology, a signal produced from a bottom of trough of the contact hole or a line pattern is attenuated. This becomes a serious obstruction to making a precise observation or an accurate length measurement thereof.

Proposed in Japanese Patent Laid-open No. 5-266855 is a SEM according to a retarding method in which an electron beam is decelerated immediately before the electron beam attains to a specimen, thereby reducing the chromatic aberration so as to embody a high resolution and enhancing an extracting efficiency of electrons obtained from the specimen. In the SEM according to the retarding method, a positive electric voltage is applied to a liner tube in an electrooptic system so as to feed high energy to an electron beam passing through a lens position, and, by generating a decelerating electric field between the liner tube and specimen, the electron beam is decelerated immediately before the electron beam attains to the specimen.

Japanese Patent Laid-open No. 9-171791 discloses that, by locating an accelerating cylinder at an extended line of a passage through which an electron beam passes in an objective lens, an accelerating voltage is applied so as to accelerate the electron beam, and, by applying a superimposing voltage to a specimen, a decelerating electric field to the electron beam is formed between the accelerating cylinder and the specimen. Secondary electrons and back scattered electrons are absorbed into the accelerating cylinder by the decelerating electric field, and are detected by a secondary electron detector located above the accelerating cylinder.

Japanese Patent Laid-open No. 9-507331 discloses that two signal detecting systems are employed, one of which is a signal detecting system for forming an image of a surface of a specimen, and the other is a signal detecting system for forming an image of a bottom part of a scontact hole.

SUMMARY OF THE INVENTION

The present invention relates to a scanning electron microscope, and more particularly to a scanning electron microscope suitable for observing, with a high resolution, a specimen having a submicron order (1 μm or less) of contact hole or line pattern.

The inventor et al. of the present invention have found that, by employing the retarding method and, further, by suppressing interferences between an electron beam and secondary electrons or back scattered electrons, it becomes possible to obtain a clearer SEM image with a higher resolution.

It is an object of the present invention to provide a scanning electron microscope which makes it possible to observe, with a higher resolution and more clearly, a submicron order (1 μm or less) of contact hole or line pattern on a semiconductor wafer.

According to the present invention, in a scanning electron microscope which comprises an electron source for producing an electron beam, a condenser lens for converging said electron beam produced at said electron source, an electron beam aperture for making smaller a diameter of said electron beam converged by said condenser lens, a scanning apparatus for scanning said electron beam, a negative electric potential applying apparatus for applying a negative electric potential to a specimen, an objective lens for converging said electron beam onto said specimen, a deflector for generating an electromagnetic field which, between said scanning apparatus and said objective lens, deflects back scattered electrons and secondary electrons produced from said specimen, and a detector located between said electron beam aperture and said scanning apparatus for detecting said back scattered electrons or said secondary electrons deflected by said deflector, the scanning electron microscope has a shield electrode provided between said detector and an optical axis of said electron beam and along said optical axis, said detector is provided in contact with said electron beam aperture, and said electromagnetic field generated by said deflector deflects said back scattered electrons and said secondary electrons in a direction opposed to said optical axis with said shield electrode sandwiched therebetween.

The present invention makes it possible to irradiate a specimen with an electron beam of low energy without lowering the accelerating voltage. This characteristic reduces chromatic aberration of the electron beam, thus allowing the SEM image to be obtained with a high resolution. At the same time, this characteristic increases electron current emitted from the specimen, thus enhancing a ratio between a secondary signal and a noise (S/N). This characteristic also prevents a charge up on a surface of the specimen, which enables secondary electrons produced from a bottom part of a contact hole to be detected with a high accuracy. Accordingly, a contrast of the SEM image becomes excellent, thus making it possible to observe the specimen with a high magnification and a high resolution.

Also, since, at a position of the detector, the electron beam is narrowly focused by the electron beam aperture, the electron beam is away sufficiently from the secondary electrons and the back scattered electrons produced from the specimen. Accordingly, there occur no interferences between the electron beam and the secondary electrons or the back scattered electrons. This makes it possible not only to stably irradiate the specimen with the electron beam but also to detect the back scattered electrons and the secondary electrons with a high accuracy.

Also, since the position of the detector is far away from the deflector, it becomes possible to decrease a deflection angle by means of the deflector. This makes it possible to reduce the aberration of the electron beam, thus allowing the SEM image to be obtained with a higher resolution.

Also, the shield electrode shields the electron beam from an electric ield generated by the detector, and thus is able to prevent a deflection trouble (such as astigmatism) of the electron beam by means of the detector.

Consequently, the scanning electron microscope according to the present invention makes it possible to obtain a clearer SEM image with a higher resolution.

DETAILED DESCRIPTION OF THE PREFERRED EMBODIMENTS

First Embodiment

Figure 1:
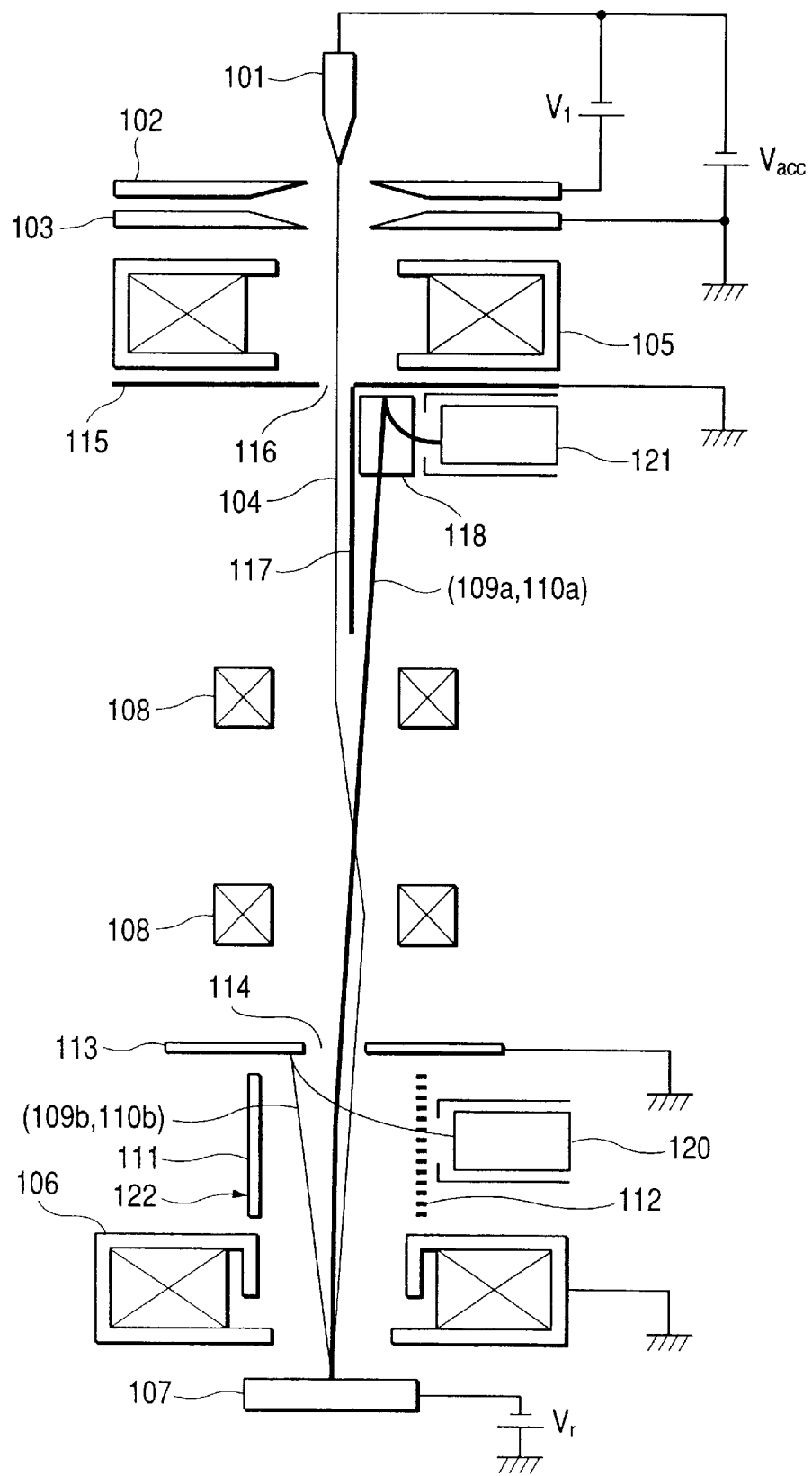
FIG. 1 is a schematic configuration diagram of a first embodiment of a scanning electron microscope in the present invention.

FIG. 1 shows a first embodiment of a scanning electron microscope.

A scanning electron microscope in the present embodiment comprises a cathode 101 for producing an electron beam 104, a first anode 102, a second anode 103 for accelerating the electron beam 104, a condenser lens 105 for converging the electron beam 104, an electron beam aperture 115 for making smaller a diameter of the electron beam 104, a scanning apparatus 108 for scanning the electron beam 104 two-dimensionally, an objective lens 106 for converging the electron beam 104 onto a specimen 107, a deflector 122 for deflecting secondary electrons 109 and back scattered electrons 110 produced from the specimen 107, a conversion electrode 113 which produces new secondary electrons when the secondary electrons 109 and the back scattered electrons 110 collide therewith, a detector 120 for detecting current of the new secondary electrons produced by the conversion electrode 113, an energy analyzer 118 for analyzing energy of secondary electrons 109a and back scattered electrons 110a which have passed through an opening 114 of the conversion electrode 113, a detector 121 for detecting electrons which, of the secondary electrons 103a and the back scattered electrons 110a, are in a specific energy range thereof, and a shield electrode 117 for shielding the electron beam 104 from electric fields of the energy analyzer 118 and the detector 121. The energy analyzer 118 and the detector 121 are located in contact with the electron beam aperture 115 and the shield electrode 117. A negative voltage Vr, which is referred to as a retarding voltage, is applied to the specimen 107.

The deflector 122 has a deflecting electric field generating apparatus arid a deflecting magnetic field generating apparatus. The deflecting electric field generating apparatus has a mesh electrode 112 and an opposing electrode 111, which are located symmetrically with the optical axis as its center. The mesh electrode 112 and the opposing electrode 111 generate a deflecting electric field for deflecting the secondary electrons 109 and the back scattered electrons 110 produced from the specimen 107. The mesh electrode 112 has a large number of holes so that the new secondary electrons produced by the conversion electrode 113 can pass therethrough.

The deflecting magnetic field generating apparatus generates a deflecting magnetic field perpendicular to the deflecting electric field generated by the deflecting electric field generating apparatus. This deflecting magnetic field prevents a direction of the electron beam 104 from being altered by the deflecting electric field by the deflecting electric field generating apparatus, and in addition alters directions of the secondary electrons 109 and the back scattered electrons 110 in the same direction as that of the deflecting electric field. Namely, the deflecting electric field and the deflecting magnetic field generated by the deflector 122 do not deflect the electron beam 104 but deflect the secondary electrons 109 and the back scattered electrons 110.

The deflecting electric field Ex is generated by providing an electric potential +Ve(V) for the mesh electrode 112 and −Ve (V) to the opposing electrode 111. The electron beam 104, for which an accelerating voltage Vacc provides a velocity Vz, undergoes an electrostatic force by means of the deflecting electric field Ex and Lorentz force Fl=−e(Ex+Vz·By) by means of the deflecting magnetic field By. Here, quantity of a coil current for generating By (the magnetic field perpendicular to the electric field Ex) or the voltage Ve is adjusted so that the electron beam 104 undergoes no deflection, i.e. Fl=0.

Described next are movements of the electron beam 104, the secondary electrons 109 and the back scattered electrons 110.

The electron beam 104, which is radiated from the cathode 101 by a voltage V1 applied between the cathode 101 and the first anode 102, is accelerated by the second anode 103 to which the voltage Vacc is applied. The accelerated electron beam 104 is converged into a minute spot by the condenser lens 105 and the objective lens 106, then being radiated onto the specimen 107. The scanning apparatus 108 comprising double scanning coils scans the electron beam 104 two-dimensionally on the specimen 107. The specimen 107 irradiated with the electron beam 104 produces the electrons, i.e. the secondary electrons 109 and the back scattered electrons 110.

The retarding voltage Vr is applied to the specimen 107. This situations forms, between the objective lens 106 and the specimen 107, an electric field which operates as a decelerating electric field for the electron beam 104 radiated onto the specimen 107 and operates as an accelerating voltage for the secondary electrons 109 and the back scattered electrons 110 produced from the specimen 107. As s result, the secondary electrons 109 have energy of Vacc(eV), and the back scattered electrons 110 have energy of Vr (eV).

Of the secondary electrons 109 and the back scattered electrons 110 produced from the specimen 107, secondary electrons 109a and back scattered electrons 110a which are produced within a range of a fixed angle around the optical axis are deflected slightly by the deflector 122 while being accelerated by the retarding voltage (However, in the case of an observation with a high magnification, the deflection angle is so small as to be negligible). Then, the secondary electrons 109a and the back scattered electrons 110a are converged in proximity to the optical axis by a lens magnetic field of the objective lens 106, become almost parallel to the electron beam 104, and then passes through the opening 114 of the conversion electrode 113. On the other hand, secondary electrons 109a and back scattered electrons 110a which are launched beyond the range of the fixed angle around the optical axis are deflected by the deflector 122, then colliding with the conversion electrode 113. The conversion electrode 113 produces the new secondary electrons when the secondary electrons 109a and the back scattered electrons 110a collide therewith. The new secondary electrons are taken in the detector 120 by the electric field between the mesh electrode 112 and the opposing electrode 111.

The secondary electrons 109a and the back scattered electrons 110a, which have passed through the opening 114, passes through the scanning apparatus 108 and are then launched into the energy analyzer 118 provided in the vicinity of and under the electron beam aperture 115. The energy analyzer 118 analyzes energy of the secondary electrons 109a and the back scattered electrons 110a, and the detector 121 detects only the electrons which are in a specific energy range.

The retarding voltage Vr is applied between the objective lens 106 and the specimen 107. This allows, without lowering an accelerating voltage, the specimen 107 to be irradiated with he electron beam 104 of low energy. This characteristic makes it possible to maintain the accelerating voltage of the electron beam 104, thereby reducing chromatic aberration of the electron beam 104 and allowing the SEM image to be obtained with a high resolution. At the same time, this characteristic increases electron current emitted from the specimen 107, thus enhancing a ratio between a secondary signal and a noise (S/N). Also, the specimen 107 is irradiated with the electron beam 104 of low energy, which prevents a charge up on a surface of the specimen and thus allows secondary electrons produced from a bottom part of a contact hole to be detected with a high accuracy. Accordingly, a contrast of the SEM image becomes excellent, thus making it possible to observe the specimen 107 with a high magnification and a high resolution.

The energy analyzer 118 and the detector 121 are provided in the vicinity of the electron beam aperture 115. Since, at that position, the electron beam 104 is narrowly focused by the electron beam aperture 115, the electron beam 104 is away sufficiently from the secondary electrons 109a and the back scattered electrons 110a. Accordingly, there occur no interferences between the electron beam 104 and the secondary electrons 109a or the back scattered electrons 110a. This makes it possible not only to stably irradiate the specimen 107 with the electron beam 104 but also to detect the back scattered electrons 110a and the secondary electrons 109a with a high accuracy.

Also, since the position of the energy analyzer 118 and the detector 121 is far away from the deflector 122, even if a deflection angle by means of the deflector 122 is small, it is possible to set the back scattered electrons 110a and the secondary electrons 109a sufficiently away from the electron beam 104. The deflection angle by means of the deflector 122 is small, which makes it possible to reduce the aberration of the electron beam, thus allowing the SEM image to be obtained with a higher resolution.

Also, the shield electrode 117 is provided among the energy analyzer 118, the detector 121, and the electron beam 104. The shield electrode 117 shields the electron beam 104 from electric fields generated by the energy analyzer 118 and the detector 121, and thus is able to prevent a deflection trouble of the electron beam 104 by means of the energy analyzer 118 and the detector 121 (such as astigmatism).

Figure 2:
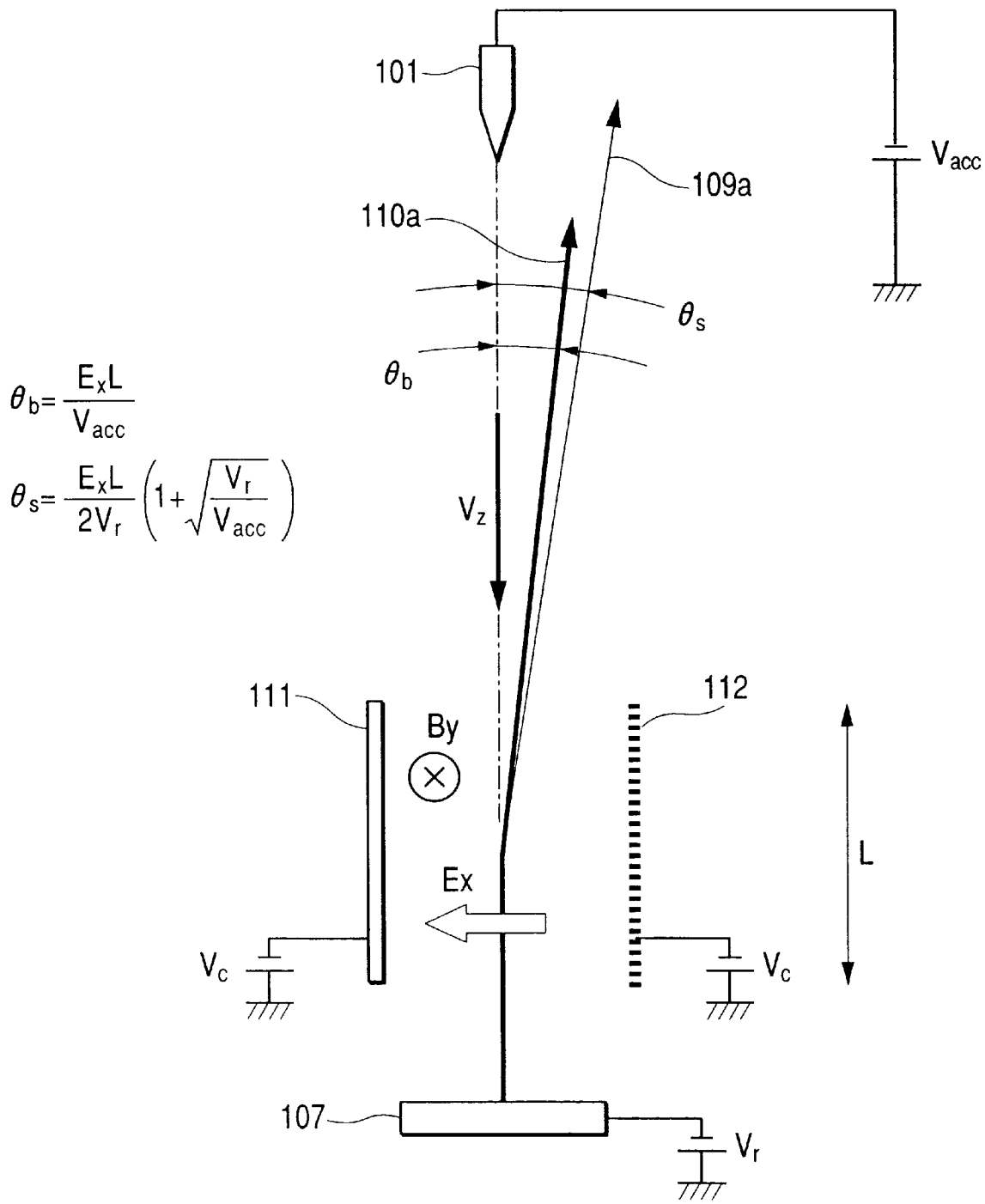
FIG. 2 is a diagram for explaining a deflector in the first embodiment of a scanning electron microscope.

Here, using FIG. 2, the description will be given concerning deflection angles θ b, θ s of the back scattered electrons 110a and the secondary electrons 109a by means of the deflector 122. The back scattered electrons 110a and the secondary electrons 109a are deflected by angles of $$\theta b = Ex \cdot L / Vacc, \text{ and}$$

$$\theta s = Ex \cdot L (1 + \sqrt{(Vr/Vacc)})/(2Vr),$$

respectively, where L is a length of the electrode.

Substituting realistic numerical values into the above-mentioned expressions, these deflection angles will be determined. If we let Vacc=3 (kV), Vr=2.5 (kV), Ex=5000 (V/m), and L=30 (mm), it turns out that θ b=0.050 and θ s=0.057. Assuming that the distance from the deflection apparatus 122 to the detector is 150 mm, the back scattered electrons 110a and the secondary electrons 109a, at a position 150 mm apart from the deflection apparatus 122, are 7.5 mm and 8.6 mm apart from the optical axis, respectively. These distances give rise to no interferences between the electron beam 104 and the back scattered electrons 110a or the secondary electrons 109a, thus allowing the back scattered electrons 110a and the secondary electrons 109a to be detected with a high accuracy.

Figures 4A, 4B:
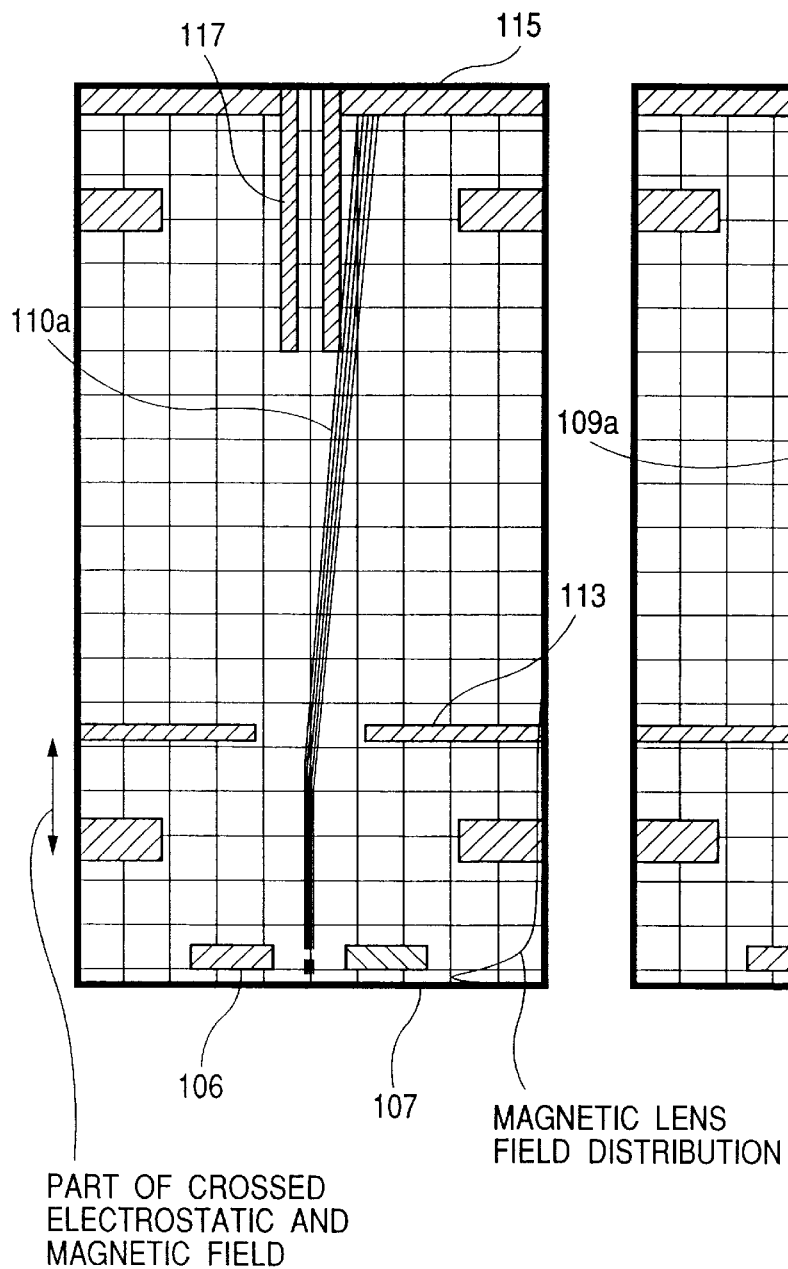
FIGS. 4(a) and 4(b) are diagrams for showing examples of results of performing numerical simulations on trajectories which are drawn until secondary electrons and back scattered electrons are launched into an energy analyzer of a detector in the first embodiment of a scanning electron microscope.

FIGS. 4(a) and 4(b) show results of performing numerical simulations on trajectories which are drawn until the secondary electrons 109a and the back scattered electrons 110a are launched into the energy analyzer of the detector. A diagram (a) shows trajectories of the back scattered electrons 110a the prospective angle θ 2 of which is less than 20 degrees, and a diagram (b) shows trajectories of the secondary electrons 109a the prospective angle θ 2 of which is less than 20 degrees. The back scattered electrons 110a in the diagram (a) are converged by an objective lens magnetic field, and are made into a parallel beam, hen moving in a direction of the detector. The moving parallel beam is deflected by the electric field and the magnetic field (crossed electrostatic and magnetic field) of the deflector 122, and thus is spatially apart from the optical axis completely because of the shield electrode 117 employed as the separator. The secondary electrons 109a in the diagram (b) are influenced not only by the objective lens magnetic field but also by the retarding electric field. This simulation result results from a case of Vr=0.5 Vacc, i.e. a case in which the beam width is enlarged most. As is the case with the diagram (a), the secondary electrons 109a are spatially apart from the optical axis because of the shield electrode 117 employed as the separator.

Figure 3:
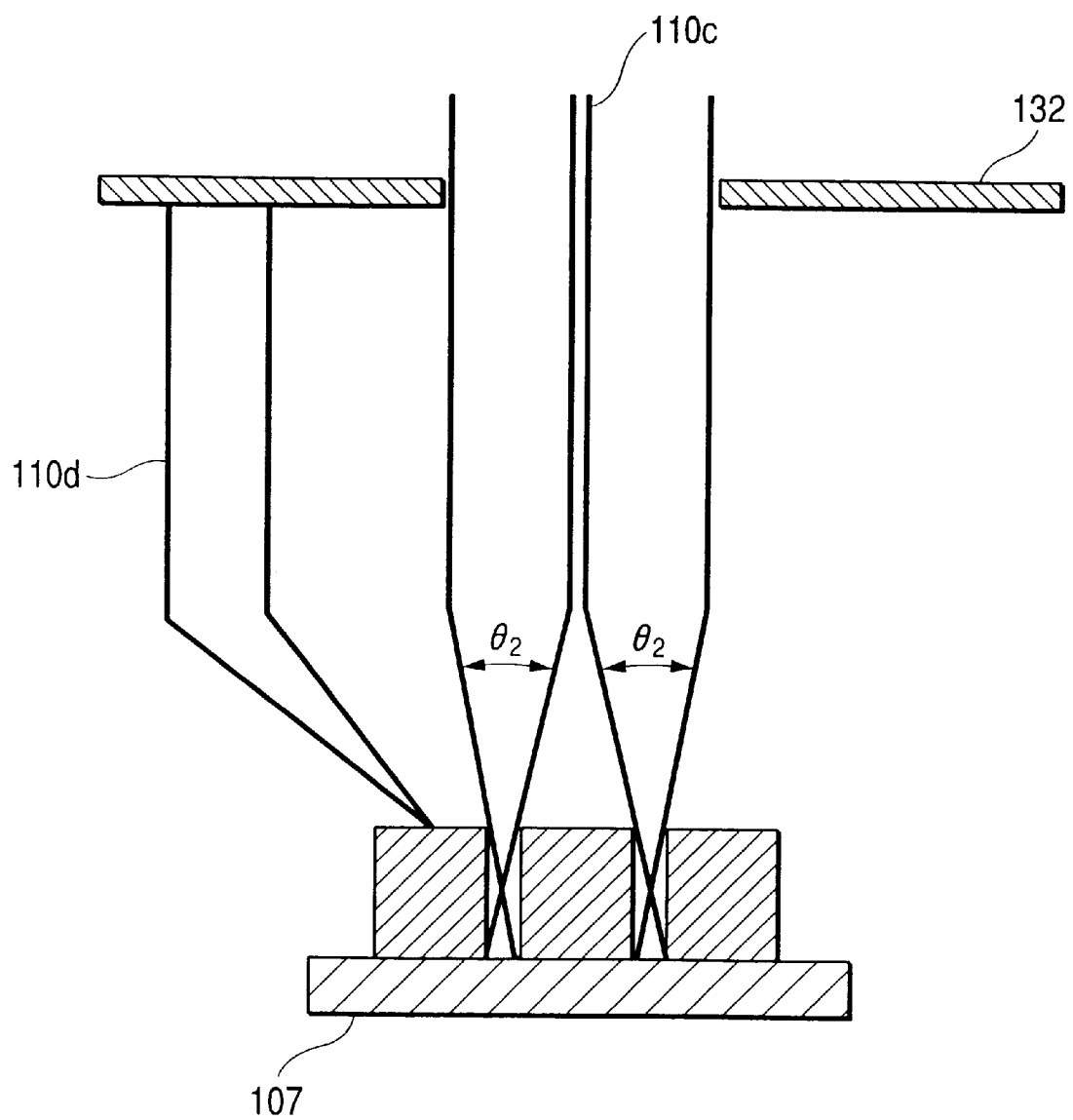
FIG. 3 is a diagram for explaining a method of observing a bottom of trough of a specimen by means of back scattered electrons in the first embodiment of a scanning electron microscope.

Described below, using FIG. 3, is a method of observing a bottom of the trough by means of back scattered electrons. When an aspect ratio of a contact hole or a line pattern is large, it is difficult to detect the secondary electrons produced from a bottom part of the pattern or the hole, and thus it is advisable to detect back scattered electrons 110c instead. However, since a prospective angle θ 2 of the opening is decreased down to about 10 degrees as the aspect ratio becomes larger, it becomes difficult to obtain a clear SEM image. Then, a collimator 132 is provided between the conversion electrode 113 and the objective lens 106, and magnitude of an opening of the collimator 132 is set to be such an extent that the back scattered electrons 110c of the prospective angle θ 2 pass through the opening. This setting allows the collimator 132 to reduce yield of a back scattered signal 110d from a surface of the specimen or a top of the projection, thus making it possible to detect only the back scattered electrons 110c produced from the bottom of the trough and then to obtain the SEM image in which the S/N is its maximum and the bottom of the trough is clear.

As described above, the scanning electron microscope in the present invention, by employing the retarding method and suppressing interferences between the electron beam and the secondary electrons or the back scattered electrons, makes it possible to obtain a clearer SEM image with a higher resolution.

Second Embodiment

Figure 5:
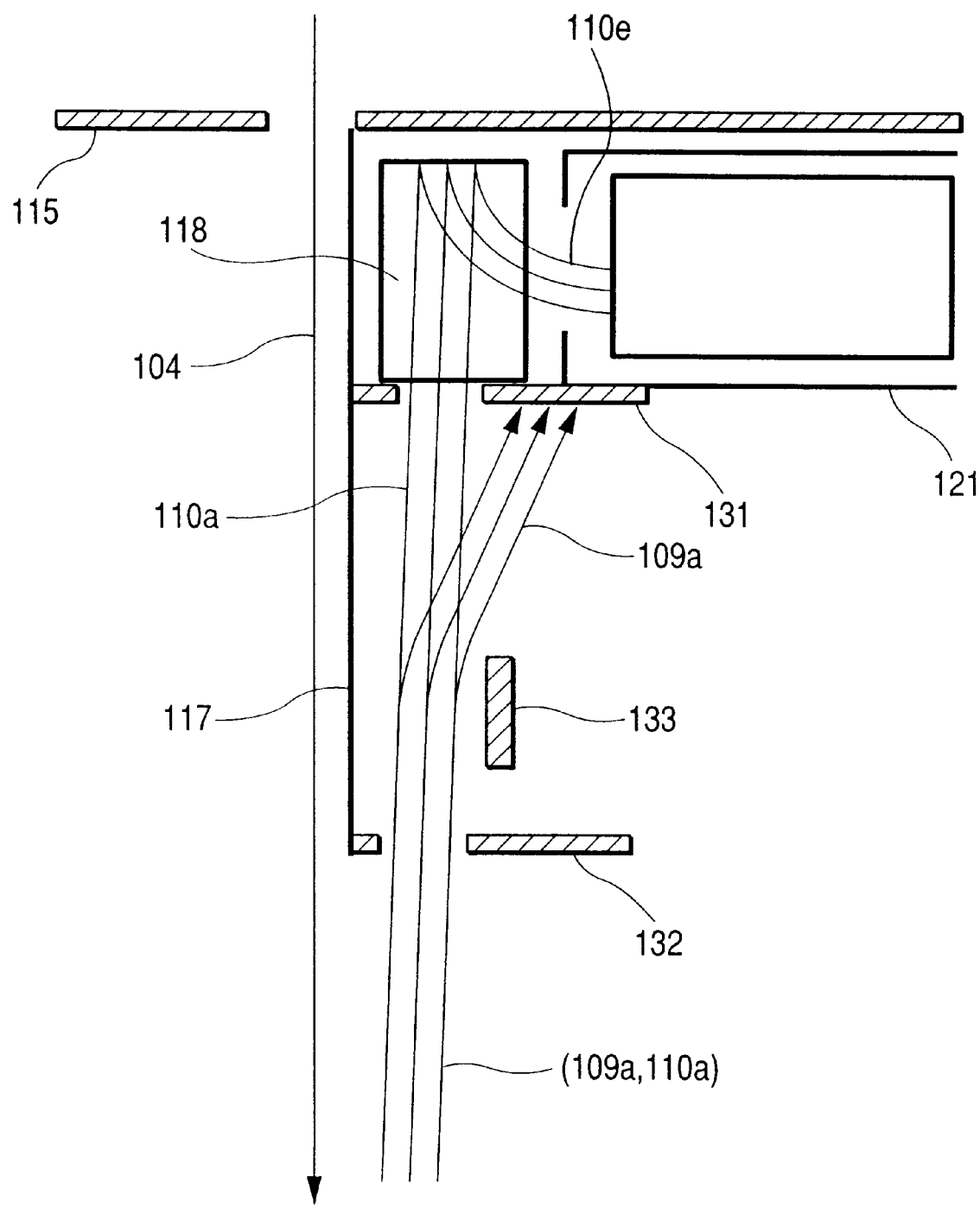
FIG. 5 is a schematic diagram of a detector in a second embodiment of a scanning electron microscope.

FIG. 5 shows a detector in a second embodiment of a scanning electron microscope. The scanning electron microscope in the present embodiment separates and detects only the back scattered electrons 110a from secondary electrons 109a and the back scattered electrons 110a emitted from a specimen 107. The detector comprises a collimator 132 which, of the secondary electrons 109a and the back scattered electrons 110a thus separated, reduces electrons which do not move toward the energy analyzer 118, a deflecting electrode 133 for deflecting the secondary electrons 109a of low energy, and an eliminating electrode 131 for eliminating the secondary electrons 109a deflected by the deflecting electrode 133.

The secondary electrons 109a and the back scattered electrons 110a being apart from the optical axis are focused by the collimator 132. The secondary electrons 109a of low energy are deflected even further by applying a positive voltage to the deflecting electrode 133, and are then eliminated by the eliminating electrode 131. The back scattered electrons 110a move straight in a direction of the energy analyzer 118, and are converted into new secondary electrons by a conversion electrode within the energy analyzer 118. The new secondary electrons are taken in a detector 121.

Providing another detector instead of the eliminating electrode 131 makes it possible to detect the secondary electrons 109a, too.

Third Embodiment

Figure 6:
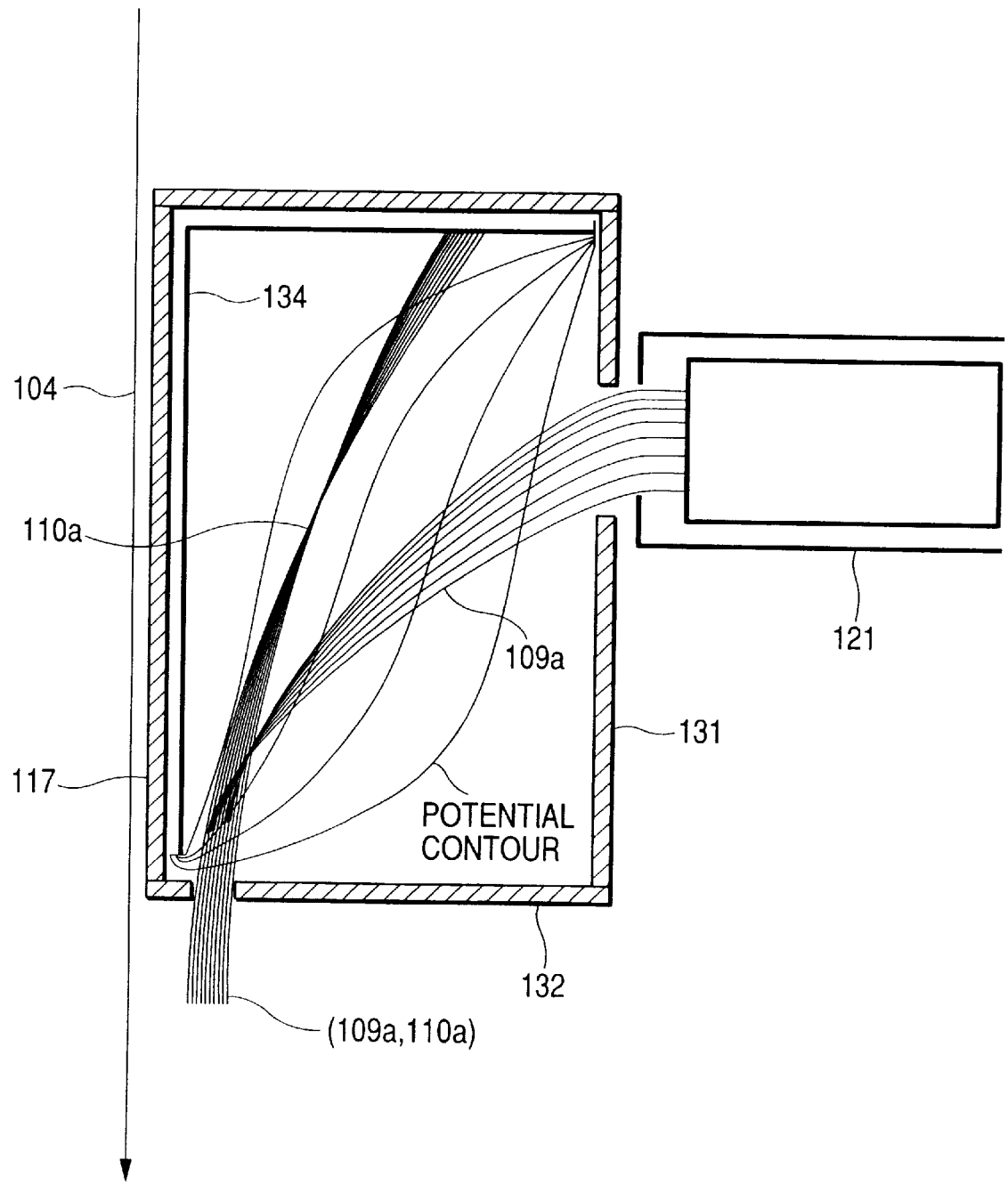
FIG. 6 is a schematic diagram of a detector in a third embodiment of a scanning electron microscope.

FIG. 6 shows a detector in a third embodiment of a scanning electron microscope. Potential contours and electron trajectories are results of numerical simulations. The scanning electron microscope in the present embodiment separates and detects only the secondary electrons 109a from the secondary electrons 109a and back scattered electrons 110a emitted from a specimen 107. The detector is constituted by surrounding a deflecting electrode 134, which forms an electric potential shown in FIG. 6, with a shield electrode 117, a collimator 132, and an eliminating electrode 131.

The secondary electrons 109a and the back scattered electrons 110a being apart from the optical axis are focused by the collimator 132. A back-scattering lens is created by applying a negative voltage to the deflecting electrode 134. The back scattered electrons 110a of high energy move approximately along the potential contours. The secondary electrons 109a of low energy, however, are back-scattered considerably and are taken in a detector 121 through a collimator 131. At that time, positions of components such as the collimator 131 should be fixed suitably so that secondary electrons, which are produced from the electrode 134 by the irradiation of the back scattered electrons 110a, do not pass through the collimator 131.

Fourth Embodiment

Figure 7:
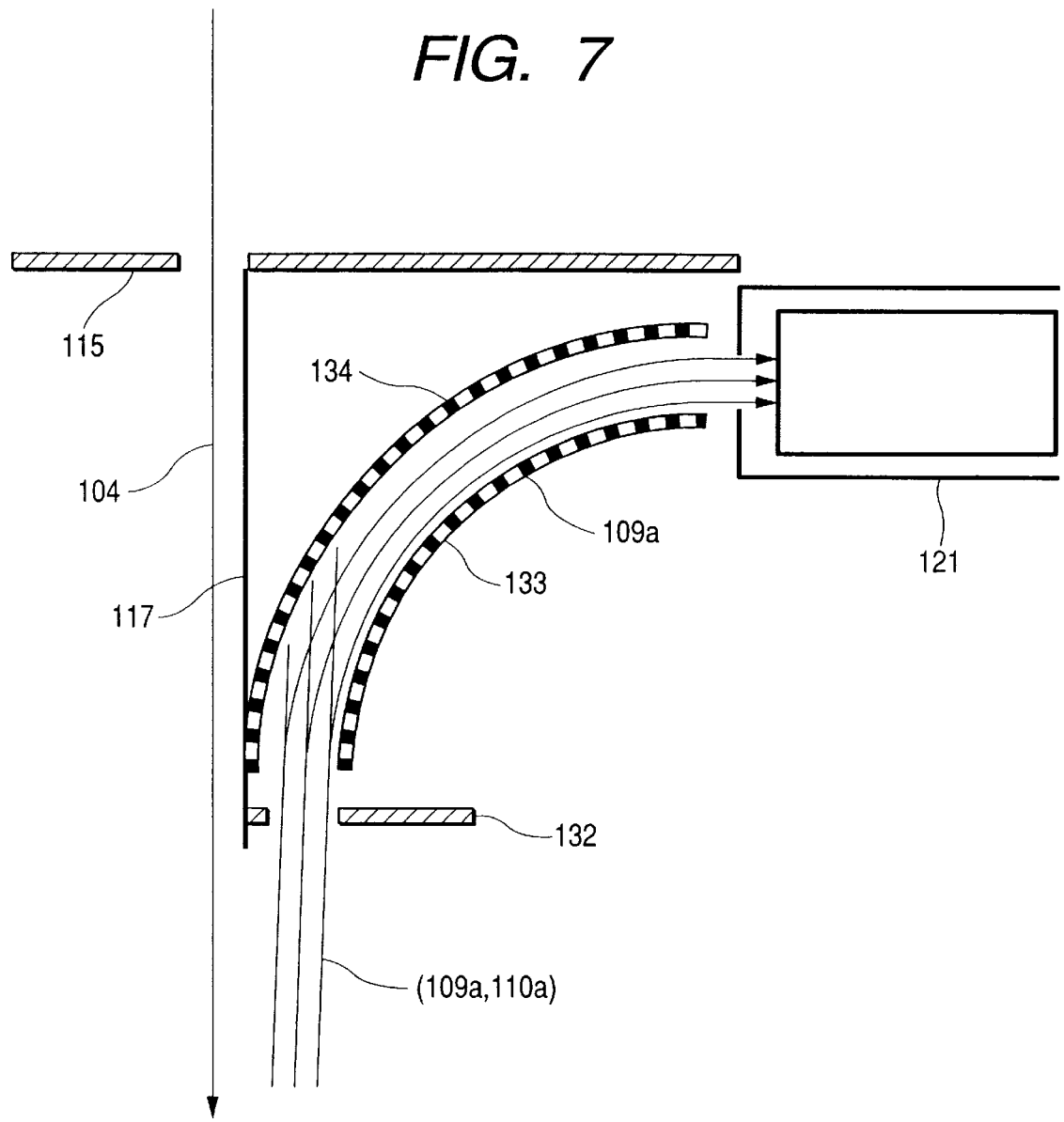
FIG. 7 is a schematic diagram of a detector in a fourth embodiment of a scanning electron microscope.

FIG. 7 shows a detector in a fourth embodiment of a scanning electron microscope. The detector in the present embodiment makes a detailed analysis of energy of secondary electrons, using a prism electric field. The prism electric field is generated by applying positive and negative voltages to spherical surface-shaped deflecting electrodes 133 and 134, respectively. Only the secondary electrons 109a having specific energy move along the electrodes, and are then taken in a detector 121.

The energy of the secondary electrons 109a extends from 0 to a few dozens of eV at the time of the generation thereof, and geometric and material information differs for each value of the energy. With energy analyzers shown in FIG. 5 and FIG. 6, it is difficult to obtain a resolving power which makes it possible to make the detailed analysis of energy of the secondary electrons. However, an employment of the prism electric field in the present embodiment allows the energy analysis of the secondary electrons 109a to be made with a resolving power of about a few eV.

Fifth Embodiment

Figure 8:
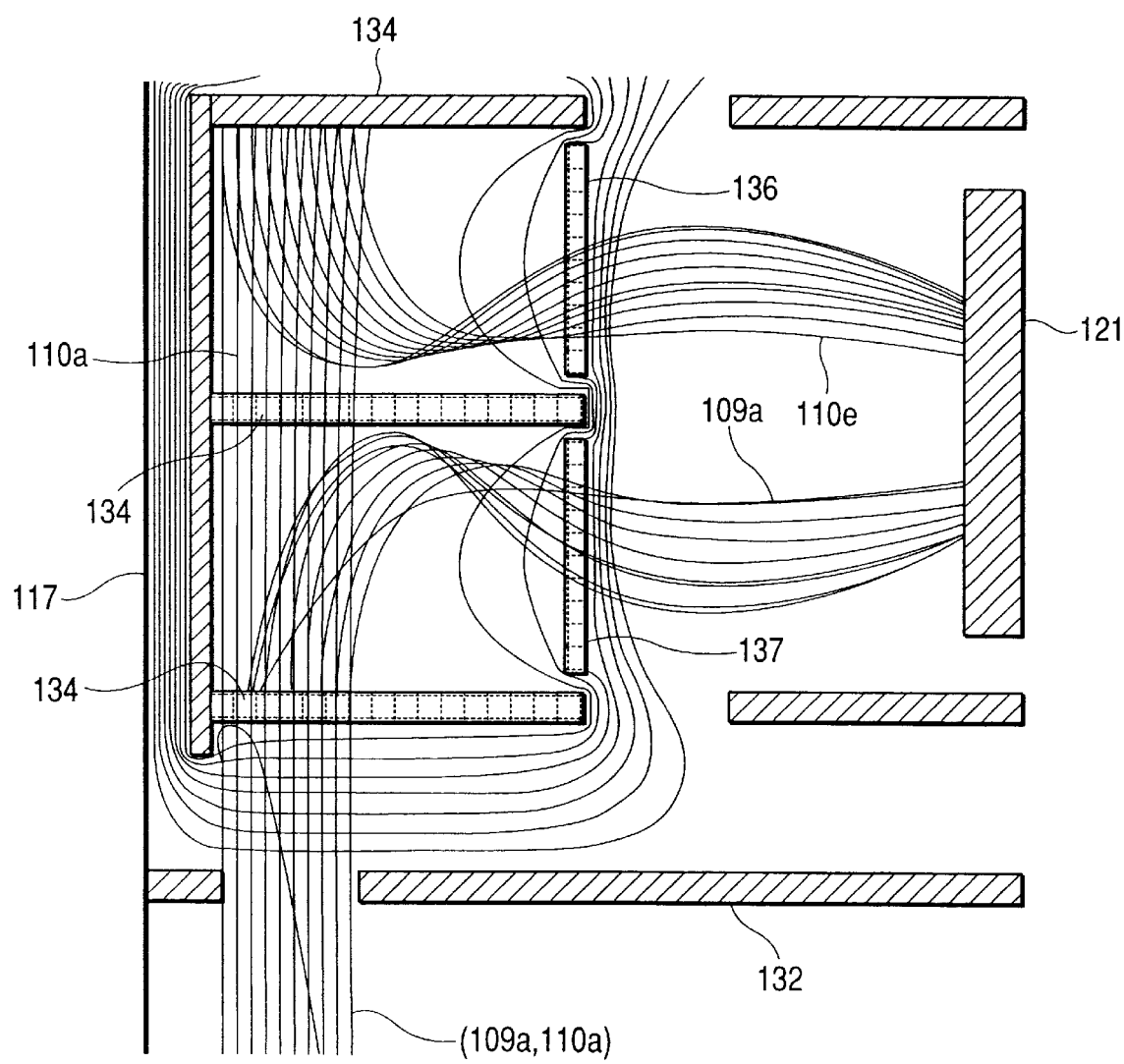
FIG. 8 is a schematic diagram of a detector in a fifth embodiment of a scanning electron microscope.

FIG. 8 shows a detector in a fifth embodiment of a scanning electron microscope. The present embodiment is constituted so that the single detector is able to detect back scattered electrons 110a and/or secondary electrons 109a. Potential contours and electron trajectories in the Figure are results of numerical simulations. The secondary electrons 109a and the back scattered electrons 110a are focused by a collimator 132. By applying a negative voltage slightly smaller than the retarding voltage Vr to an electrode 134, energy of the secondary electrons 109a is brought back to energy at the time of generation of the secondary electrons. If a voltage higher than the electrode 134 is applied to an electrode 137, the secondary electrons 109a, which have the energy at the time of the generation of the secondary electrons, are deflected and launched into a detector 121.

On the other hand, the back scattered electrons 110a undergo almost no deflection by means of the electrodes 136, 137, move straight and collide with the electrode 134, thereby producing new secondary electrons. The new secondary electrons are deflected by the electrode 136 in a direction of the detector 121, and detected.

Sixth Embodiment

Figure 9A:
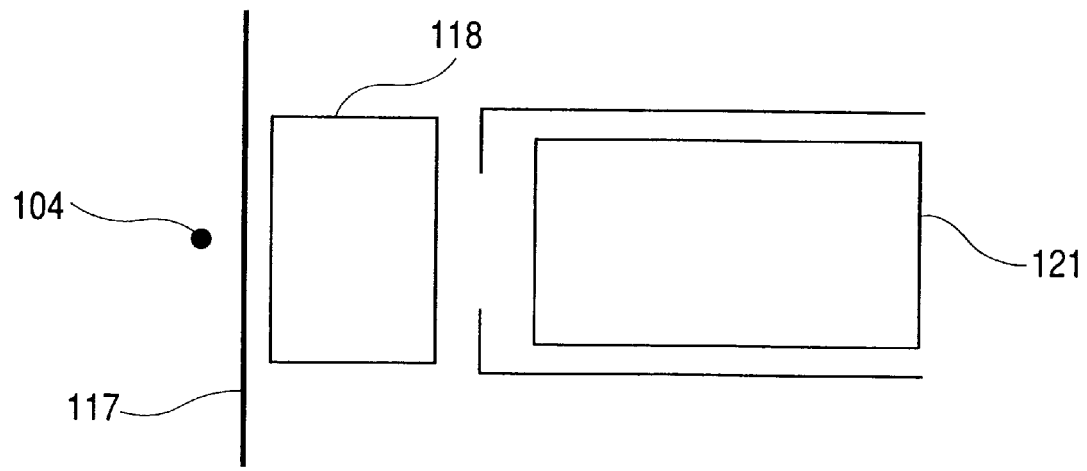
FIGS. 9(a) and 9(b) are schematic diagrams of a shield electrode in the fifth embodiment of a scanning electron microscope.
Figure 9B:
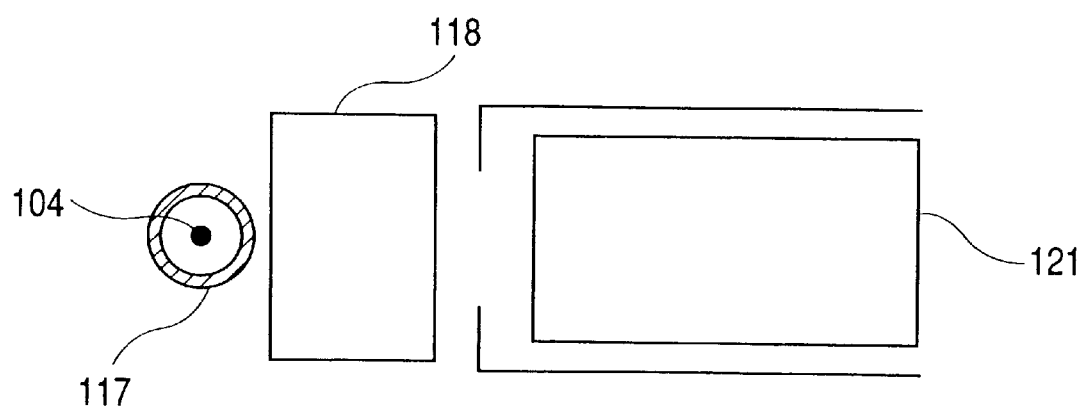

FIGS. 9(a) and 9(b) show a shield electrode 117 in a sixth embodiment of a scanning electron microscope. Both diagrams (a), (b) in FIG. 9 are diagrams in which the shield electrode 117 is seen in a direction of the optical axis. The diagram (a) indicates a situation in which the shield electrode 117, an energy analyzer 118 in a detector, and a detector 121 are integrally-constituted, and the constitution as a whole is moved to a position at which it exerts no influence on an electron beam 104. As the distance between the shield electrode 117 and the electron beam 104 becomes shorter, it becomes possible to decrease deflection angles of secondary electrons 109 and back scattered electrons 110 in a deflector 122. Namely, it is possible to weaken deflecting electric and magnetic fields in the deflector 122, which makes it possible to reduce the influence on the electron beam 104.

On the other hand, in the diagram (b), the optical axis is shielded in advance by a circular tube-shaped shield electrode 117. The electron beam 104 becomes narrowest in the vicinity of an electron beam aperture 115. Accordingly, if the shield electrode 117 is integrally-constituted with the electron beam aperture 115, the subtle optical axis alignment turns out to be unnecessary, thus making it easy to operate the scanning electron microscope.

What is claimed is:

1. A scanning electron microscope, comprising:

an electron source for producing an electron beam;

a condenser lens for converging said electron beam produced at said electron source;

an electron beam aperture for lessening a diameter of said electron beam converged by said condenser lens;

a scanning apparatus for scanning said electron beam;

a negative electric potential applying apparatus for applying a negative electric potential to a specimen;

an objective lens for converging said electron beam onto said specimen;

a deflector for generating an electromagnetic field which, between said scanning apparatus and said objective lens, deflects back scattered electrons and secondary electrons produced from said specimen; and a detector located between said electron beam aperture and said scanning apparatus for detecting said back scattered electrons or said secondary electrons deflected by said deflector;

said scanning electron microscope further having a shield electrode provided between said detector and an optical axis of said electron beam and along said optical axis, said detector being provided in contact with said electron beam aperture, said electromagnetic field generated by said deflector deflecting said back scattered electrons and said secondary electrons in a direction opposed to said optical axis with said shield electrode sandwiched therebetween.

2. The scanning electron microscope as claimed in claim 1, further comprising a collimator which, of said back scattered electrons produced from said specimen, reduces back scattered electrons produced from a surface of said specimen.

3. The scanning electron microscope as claimed in claim 1, wherein said detector separates said back scattered electrons from said secondary electrons so as to detect said back scattered electrons and said secondary electrons.

4. The scanning electron microscope as claimed in claim 3, wherein said detector has a deflecting electrode for deflecting said secondary electrons and an eliminating electrode for eliminating said secondary electrons deflected by said deflecting electrode.

5. The scanning electron microscope as claimed in claim 3, wherein said detector has an electric field prism.

6. The scanning electron microscope as claimed in claim 1, wherein said detector has a conversion electrode for converting said back scattered electrons into said secondary electrons, and detects said secondary electrons converted by said conversion electrode.

* * * * *

UNITED STATES PATENT AND TRADEMARK OFFICE
CERTIFICATE OF CORRECTION

PATENT NO. : 6,043,491
DATED : 28 March 2000
INVENTOR(S) : Yoiche Ose et al.

It is certified that error appears in the above-identified patent and that said Letters Patent is hereby corrected as shown below:

| Column | Line | |
|---|---|---|
| 1 | 23 | Change "applied" to --used--. |
| 1 | 33 | Change "AL" to --AI--. |
| 1 | 37 | Before "secondary" insert --and--. |
| 1 | 60 | Change "embody" to --attain--. |
| 1 | 61 | Delete "of". |
| 2 | 9 | Change "attains to" to --irradiates--. |
| 2 | 18 | Change "attains to" to --irradiates--. |
| 2 | 35 | Change "scontact" to --contact--. |
| 3 | 42 | Change "ield" to --field--. |
| 3 | 43 | Change "trouble" to --problem--. |

UNITED STATES PATENT AND TRADEMARK OFFICE
CERTIFICATE OF CORRECTION

PATENT NO.   : 6,043,491
DATED        : 28 March 2000
INVENTOR(S)  : Yoiche OSE et al.

It is certified that error appears in the above-identified patent and that said Letters Patent is hereby corrected as shown below:

| Column | Line | |
|---|---|---|
| 4 | 34 | Change "103a" to --109a--. |
| 4 | 43 | Change "arid" to --and--. |
| 5 | 33 | Change "Vace" to --Vacc--. |
| 5 | 46 | Change "passes" to --pass-- |
| 5 | 59 | Change "passes" to --pass-- |
| 6 | 43 | Before "deflection" delete "a". |
| 6 | 44 | Change "trouble" to --problem--. |
| 6 | 59 | Change "turns out" to --results--. |
| 7 | 12 | Change "hen" to --then--. |

UNITED STATES PATENT AND TRADEMARK OFFICE
CERTIFICATE OF CORRECTION

PATENT NO. : 6,043,491
DATED : 28 March 2000
INVENTOR(S) : Yoiche OSE et al.

It is certified that error appears in the above-identified patent and that said Letters Patent is hereby corrected as shown below:

| Column | Line | |
|---|---|---|
| 7 | 21 | Change "results" to --arises--. |
| 9 | 20 | Change "constitution" to --apparatus--. |

Signed and Sealed this

Fifth Day of June, 2001

Attest:

*Attesting Officer*

NICHOLAS P. GODICI

*Acting Director of the United States Patent and Trademark Office*